United States Patent
Swanson et al.

(10) Patent No.: US 9,812,342 B2
(45) Date of Patent: Nov. 7, 2017

(54) REDUCED WIRE COUNT HEATER ARRAY BLOCK

(71) Applicant: Watlow Electric Manufacturing Company, St. Louis, MO (US)

(72) Inventors: Cal T. Swanson, St. Louis, MO (US); Louis P. Steinhauser, St. Louis, MO (US)

(73) Assignee: WATLOW ELECTRIC MANUFACTURING COMPANY, St. Louis, MO (US)

(*) Notice: Subject to any disclaimer, the term of this patent is extended or adjusted under 35 U.S.C. 154(b) by 22 days.

(21) Appl. No.: 14/962,733

(22) Filed: Dec. 8, 2015

(65) Prior Publication Data

US 2017/0162407 A1  Jun. 8, 2017

(51) Int. Cl.
*H05B 1/02* (2006.01)
*H01L 21/67* (2006.01)

(52) U.S. Cl.
CPC .. *H01L 21/67103* (2013.01); *H01L 21/67109* (2013.01); *H01L 21/67248* (2013.01); *H05B 1/0233* (2013.01)

(58) Field of Classification Search
CPC ............ H01L 21/67103; H05B 1/0233; H05B 3/0047; H05B 1/0202; H05B 2003/005
USPC ........... 219/121.43, 497, 483–487, 202, 517; 118/725; 156/345.52
See application file for complete search history.

(56) References Cited

U.S. PATENT DOCUMENTS

| | | | |
|---|---|---|---|
| 5,105,067 A * | 4/1992 | Brekkestran | G05D 23/2401 2/69 |
| 5,948,298 A * | 9/1999 | Ijaz | B60L 1/08 180/68.5 |
| 5,951,896 A * | 9/1999 | Mahawili | C30B 25/10 219/405 |
| 6,355,915 B1 * | 3/2002 | Ziaimehr | H05B 1/0277 219/412 |
| 7,196,295 B2 | 3/2007 | Fennewald et al. | |
| 7,525,068 B2 * | 4/2009 | Jang | F27B 5/04 118/50.1 |
| 8,378,266 B2 | 2/2013 | Steinhauser et al. | |

(Continued)

FOREIGN PATENT DOCUMENTS

WO    2013025852    2/2013

OTHER PUBLICATIONS

ISRWO of PCT/US2016/065352 dated Feb. 10, 2017.

*Primary Examiner* — Mark Paschall
(74) *Attorney, Agent, or Firm* — Burris Law, PLLC (57) ABSTRACT

A thermal system includes a plurality of thermal elements. In one form, each of the thermal elements define a resistor and a current limiting device. The plurality of thermal elements have at least a first subset of parallel thermal elements and at least a second subset of parallel thermal elements. The system also has a plurality of power lines connected to the plurality of thermal elements. The power lines are configured in pairs for providing power to a subset of the plurality of thermal elements that are connected in a parallel set. Each of the pairs of power lines share a common power line with an adjacent parallel set of thermal elements within a subset. Additionally, each of the current limiting devices in the adjacent parallel sets of thermal elements within a subset are opposed. The first and second subsets of parallel thermal elements share the common power line.

22 Claims, 7 Drawing Sheets

(56) References Cited

U.S. PATENT DOCUMENTS

| | | | |
|---|---|---|---|
| 8,466,390 B2* | 6/2013 | Gaertner, II | B64D 15/12 |
| | | | 219/201 |
| 9,123,756 B2 | 9/2015 | Schmidt | |
| 2011/0092072 A1 | 4/2011 | Singh | |
| 2013/0047918 A1* | 2/2013 | Bertram, Jr. | C30B 25/14 |
| | | | 117/102 |
| 2013/0220991 A1* | 8/2013 | Honeck | E01B 7/24 |
| | | | 219/483 |

* cited by examiner

REDUCED WIRE COUNT HEATER ARRAY BLOCK

FIELD

The present disclosure relates to thermal systems and their related controls, and in particular, thermal systems that can deliver a precise temperature profile to a heating target during operation in order to compensate for heat loss and/or other variations, in such applications as chucks or susceptors for use in semiconductor processing.

BACKGROUND

The statements in this section merely provide background information related to the present disclosure and may not constitute prior art.

Figure 1:
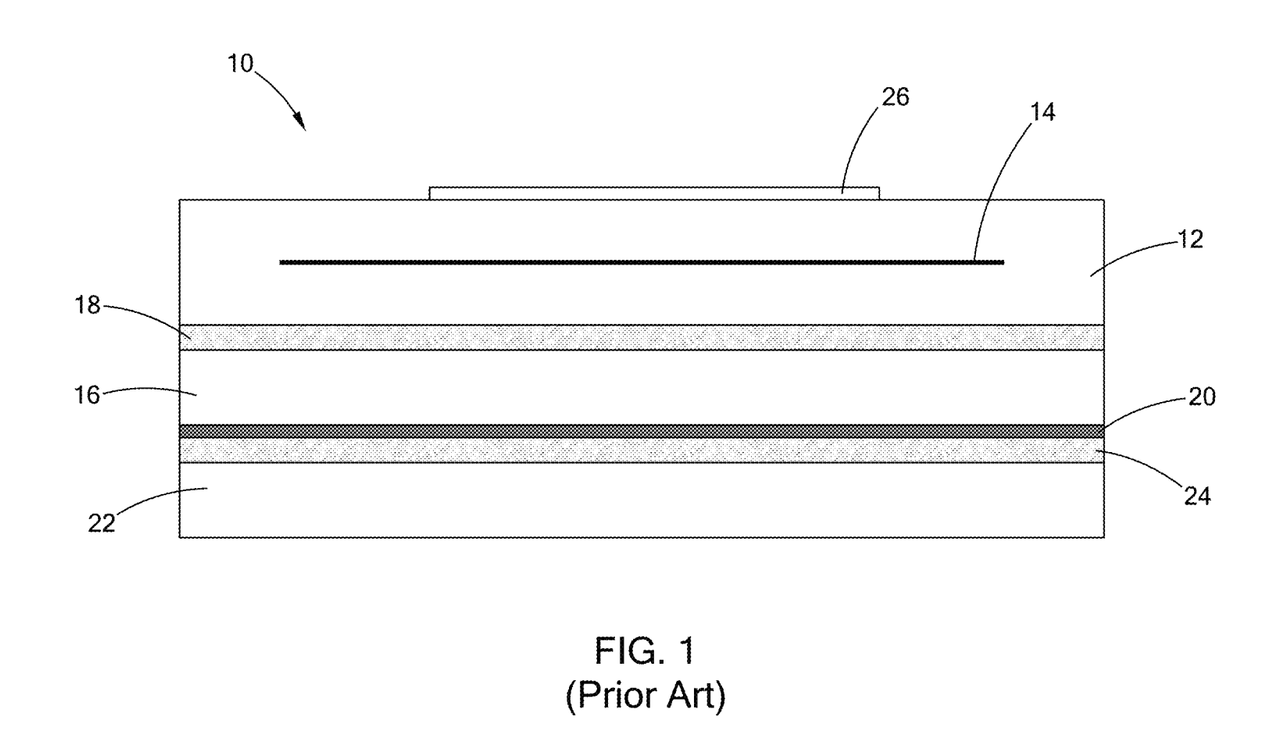
FIG. 1 is an elevated side view of a prior art electrostatic chuck.

In the art of semiconductor processing, for example, a chuck or susceptor is used to hold a substrate (or wafer) and to provide a uniform temperature profile to the substrate during processing. Referring to FIG. 1, a support assembly 10 for an electrostatic chuck is illustrated, which includes the electrostatic chuck 12 with an embedded electrode 14, and a heater plate or target 16 that is bonded to the electrostatic chuck 12 through an adhesive layer 18, which is typically a silicone adhesive. A heater 20 is secured to the heater plate or target 16, which may be an etched-foil heater, by way of example. This heater assembly is bonded to a cooling plate 22, again through an adhesive layer 24 that is typically a silicone adhesive. The substrate 26 is disposed on the electrostatic chuck 12, and the electrode 14 is connected to a voltage source (not shown) such that electrostatic power is generated, which holds the substrate 26 in place. A radio frequency (RF) or microwave power source (not shown) may be coupled to the electrostatic chuck 12 within a plasma reactor chamber that surrounds the support assembly 10. The heater 20 thus provides requisite heat to maintain temperature on the substrate 26 during various in-chamber plasma semiconductor processing steps, including plasma enhanced film deposition or etch.

During all phases of processing of the substrate 26, it is important that the temperature profile of the electrostatic chuck 12 be tightly controlled in order to reduce processing variations within the substrate 26 being etched, while reducing total processing time. Improved devices and methods for improving temperature uniformity on the substrate are continually desired in the art of semiconductor processing, among other applications.

SUMMARY

A thermal system includes a plurality of thermal elements. Each of the thermal elements define a resistor and a current limiting device. The plurality of thermal elements have at least a first subset of parallel thermal elements and at least a second subset of parallel thermal elements. The system also has a plurality of power lines connected to the plurality of thermal elements. The power lines are configured in pairs for providing power to a subset of the plurality of thermal elements that are connected in a parallel set. Each of the pairs of power lines share a common power line with an adjacent parallel set of thermal elements within a subset. Additionally, each of the current limiting devices in the adjacent parallel sets of thermal elements within a subset are opposed. The first and second subsets of parallel thermal elements share the common power line.

A heater system includes a heating target and a heater secured to the heating target. The heater has a plurality of thermal elements. Each of the thermal elements define a resistor and a current limiting device. The plurality of thermal elements have at least a first subset of parallel thermal elements and at least a second subset of parallel thermal elements. The system also has a plurality of power lines connected to the plurality of thermal elements. The power lines are configured in pairs for providing power to a subset of the plurality of thermal elements that are connected in a parallel set. Each of the pairs of power lines share a common power line with an adjacent parallel set of thermal elements within a subset. Additionally, each of the current limiting devices in the adjacent parallel sets of thermal elements within a subset are opposed. The first and second subsets of parallel thermal elements share the common power line.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. For example, the following forms of the present disclosure are directed to chucks for use in semiconductor processing, and in some instances, electrostatic chucks. However, it should be understood that the heaters and systems provided herein may be employed in a variety of applications and are not limited to semiconductor processing applications. It should be understood that throughout the drawings, corresponding reference numerals indicate like or corresponding parts and features.

Figure 2A:
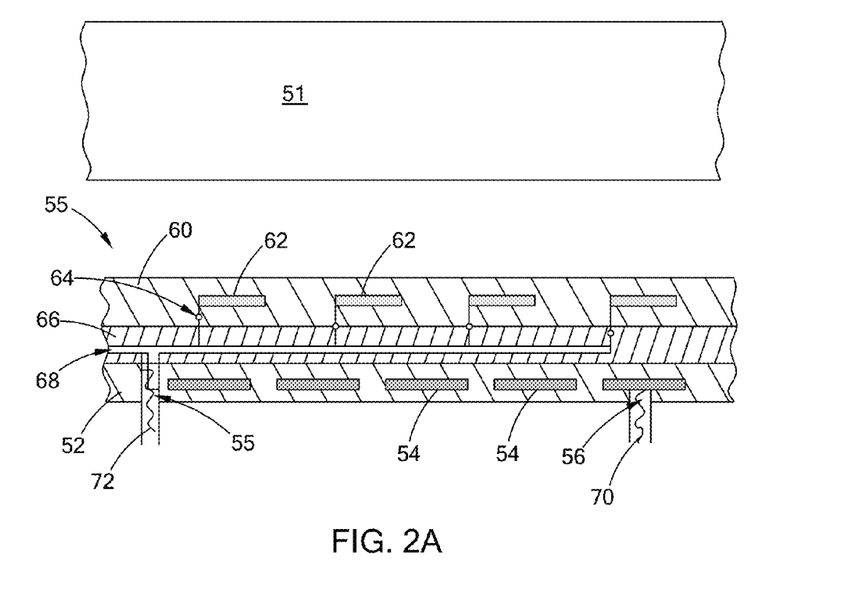
FIG. 2A is a partial side view of a heater having a tuning layer and constructed in accordance with the principles of one form of the present disclosure.

Referring to FIG. 2A, one form of the present disclosure is a heater 50 that includes a base heater layer 52 having at least one heater circuit 54 embedded therein. The base heater layer 52 has at least one aperture 56 (or via) formed there through for connecting the heater circuit 54 to a power supply (not shown). The base heater layer 52 provides primary heating while a tuning heater layer 60 disposed proximate the heater layer 52 as shown provides for fine tuning of a heat distribution provided by the heater 50. The tuning layer 60 includes a plurality of individual heating elements 62 embedded therein, which are independently controlled. At least one aperture 64 is formed through the tuning layer 60 for connecting the plurality of individual heating elements 62 to the power supply and controller (not shown). As further shown, a routing layer 66 is disposed between the base heater layer 52 and the tuning layer 60 and defines an internal cavity 68. A first set of electrical leads 70 connects the heater circuit 54 to the power supply, which extends through the heater layer aperture 56. A second set of electrical leads 72 connects a plurality of heating elements 62 to the power supply and extend through the internal cavity 68 of the routing layer 66, in addition to the aperture 55 in the base heater layer 52. It should be understood that the routing layer 66 is optional, and the heater 50 could be employed without the routing layer 66 and instead having only the base heater layer 52 and the tuning heater layer 60.

In another form, rather than providing fine tuning of a heat distribution, the tuning layer 60 may alternately be used to measure temperature in the chuck 12. This form provides for a plurality of area-specific or discreet locations, of temperature dependent resistance circuits. Each of these temperature sensors can be individually read via a multiplexing switching arrangement to allow substantially more sensors to be used relative to the number of signal wires required to measure each individual sensor, such as shown in U.S. Pat. No. 9,123,756, which is commonly assigned with the present application and the disclosure of which is incorporated herein by reference in their entirety. The temperature sensing feedback can provide necessary information for control decisions, for instance, to control a specific zone of backside cooling gas pressure to regulate heat flux from the substrate 26 to the chuck 12. This same feedback can also be used to replace or augment temperature sensors installed near the base heater 50 for temperature control of base heating zones 54 or balancing plate cooling fluid temperature (not shown) via ancillary cool fluid heat exchangers.

In one form, the base heater layer 50 and the tuning heater layer 60 are formed from enclosing heater circuit 54 and tuning layer heating elements 62 in a polyimide material for medium temperature applications, which are generally below 250° C. Further, the polyimide material may be doped with materials in order to increase thermal conductivity.

In other forms, the base heater layer 50 and/or the tuning heater layer 60 are formed by a layered process, wherein the layer is formed through application or accumulation of a material to a substrate or another layer using processes associated with thick film, thin film, thermal spraying, or sol-gel, among others.

In one form, the base heating circuit 54 is formed from Inconel® and the tuning layer heating elements 62 are a Nickel material. In still another form, the tuning layer heating elements 62 are formed of a material having sufficient temperature coefficient of resistance such that the elements function as both heaters and temperature sensors. Such heaters and their materials are disclosed in U.S. Pat. Nos. 7,196,295 and 8,378,266, which are commonly assigned with the present application and the disclosures of which are incorporated herein by reference in their entirety.

Various forms of the present disclosure include temperature, power, and/or thermal impedance based control over the layer heating elements 62 through knowledge or measurement of voltage and/or current applied to each of the individual elements in the thermal impedance tuning layer 60, converted to electrical power and resistance through multiplication and division, corresponding in the first instance, identically to the heat flux output from each of these elements and in the second, a known relationship to the element temperature. Together these can be used to calculate and monitor the thermal impedance load on each element to allow an operator or control system to detect and compensate for area-specific thermal changes that may result from, but are not limited to, physical changes in the chamber or chuck due to use or maintenance, processing errors, and equipment degradation. Alternatively, each of the individually controlled heating elements in the thermal impedance tuning layer 60 can be assigned a setpoint resistance corresponding to the same or different specific temperatures which then modify or gate the heat flux originating from corresponding areas on a substrate through to the base heater layer 52 to control the substrate temperature during semiconductor processing.

In one form, the base heater 50 is bonded to a chuck 51, for example, by using a silicone adhesive or even a pressure sensitive adhesive. Therefore, the heater layer 52 provides primary heating, and the tuning layer 60 fine tunes, or adjusts, the heating profile such that a uniform or desired temperature profile is provided to the chuck 51, and thus the substrate (not shown).

In another form of the present disclosure, the coefficient of thermal expansion (CTE) of the tuning layer heating elements 62 is matched to the CTE of the tuning heating layer substrate 60 in order to improve thermal sensitivity of the tuning layer heating elements 62 when exposed to strain loads. Many suitable materials for two-wire control exhibit similar characteristics to Resistor Temperature Devices (RTDs), including resistance sensitivity to both temperature and strain. Matching the CTE of the tuning layer heating elements 62 to the tuning heater layer substrate 60 reduces strain on the actual heating element. And as the operating temperatures increase, strain levels tend to increase, and thus CTE matching becomes more of a factor. In one form, the tuning layer heating elements 62 are a high purity Nickel-Iron alloy having a CTE of approximately 15 ppm/° C., and the polyimide material that encloses it has a CTE of approximately 16 ppm/° C. In this form, materials that bond the tuning heater layer 60 to the other layers exhibit elastic characteristics that physically decouple the tuning heater layer 60 from other members of the chuck 12. It should be understood that other materials with comparable CTEs may also be employed while remaining within the scope of the present disclosure.

Figure 2B:
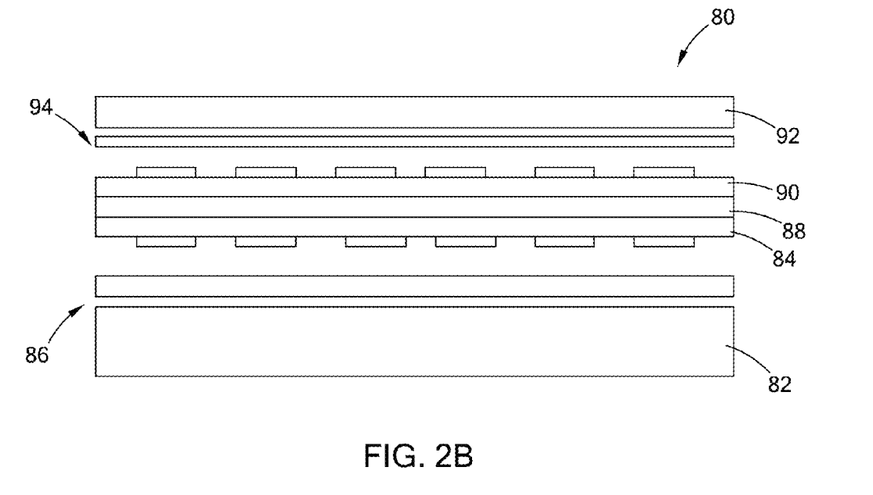
FIG. 2B is an exploded side view of another form of the heater having a tuning layer or tuning heater and constructed in accordance with the principles of the present disclosure.
Figure 2C:
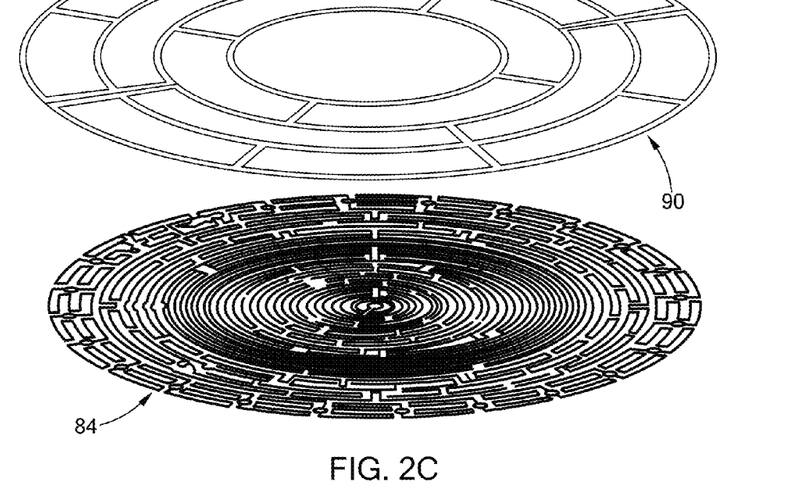
FIG. 2C is a perspective exploded view of a heater illustrating an exemplary four (4) zones for the base heater and eighteen (18) zones for the tuning heater in accordance with the principles of the present disclosure.
Figure 2D:
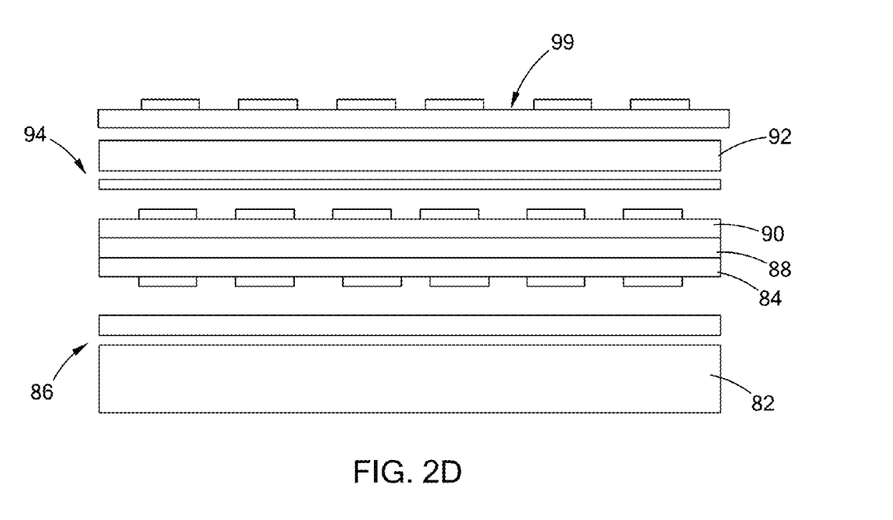
FIG. 2D is a side view of another form of a high definition heater system having a supplemental tuning layer and constructed in accordance with the principles of the present disclosure.

Referring now to FIGS. 2B-2D, one exemplary form of the heater having both a base heater layer and a tuning layer (as generally set forth above in FIG. 2A) is illustrated and generally indicated by reference numeral 80. The heater 80 includes a base plate or target 82, (also referred to as a cooling plate), which in one form is an Aluminum plate approximately 16 mm in thickness. A base heater 84 is secured to the base plate or target 82, in one form using an elastomeric bond layer 86 as shown. A substrate 88 is disposed on top of the base heater 84 and is an Aluminum material approximately 1 mm in thickness according to one form of the present disclosure. The substrate 88 is designed to have a thermal conductivity to dissipate a requisite amount of power from the base heater 84. Because the base heater 84 has relatively high power, without a requisite amount of thermal conductivity, this base heater 84 would leave "witness" marks (from the resistive circuit trace) on adjacent components, thereby reducing the performance of the overall heater system.

A tuning heater 90 is disposed on top of the substrate 88 and is secured to a chuck 92 using an elastomeric bond layer 94, as set forth above. The chuck 92 in one form is an Aluminum Oxide material having a thickness of approximately 2.5 mm. It should be understood that the materials and dimensions as set forth herein are merely exemplary and thus the present disclosure is not limited to the specific forms as set forth herein. Additionally, the tuning heater 90 has lower power than the base heater 84, and as set forth above, the substrate 88 functions to dissipate power from the base heater 84 such that "witness" marks do not form on the tuning heater 90.

The base heater 84 and the tuning heater 90 are shown in greater detail in FIG. 2C in which an exemplary four (4) zones are shown for the base heater 84, and eighteen (18) zones for the tuning heater 90. In one form, the heater 80 is adapted for use with chuck sizes of 450 mm, however, the heater 80 may be employed with larger or smaller chuck sizes due to its ability to highly tailor the heat distribution. Additionally, the high definition heater 80 may be employed around a periphery of the chuck, or in predetermined locations across the chuck, rather than in a stacked/planar configuration as illustrated herein. Further still, the high definition heater 80 may be employed in process kits, chamber walls, lids, gas lines, and showerheads, among other components within semiconductor processing equipment. It should also be understood that the heaters and control systems illustrated and described herein may be employed in any number of applications, and thus the exemplary semiconductor heater chuck application should not be construed as limiting the scope of the present disclosure.

The present disclosure also contemplates that the base heater 84 and the tuning heater 90 not be limited to a heating function. It should be understood that one or more of these members, referred to as a "base functional layer" and a "tuning layer," respectively, may alternately be a temperature sensor layer or other functional member while remaining within the scope of the present disclosure.

As shown in FIG. 2D a dual tuning capability may be provided with the inclusion of a secondary tuning layer heater 99 on the top surface of the chuck 12. The secondary tuning layer may alternately be used as a temperature sensing layer rather than a heating layer while remaining within the scope of the present disclosure. Accordingly, any number of tuning layer heaters may be employed and should not be limited to those illustrated and described herein. It should also be understood that the thermal array as set forth in the following may be employed with a single heater or multiple heaters, whether layered or in other configurations, while remaining within the scope of the present disclosure.

Figure 3:
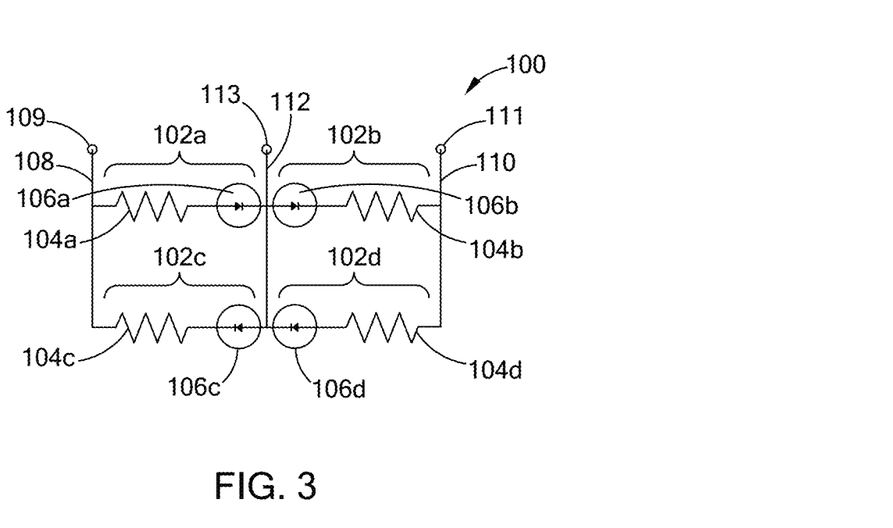
FIG. 3 is a schematic view illustrating a thermal system according to the principles of the present disclosure.

Referring to FIG. 3, a thermal system 100 for use in a thermal array system, such as those described in FIGS. 2A-2D is shown. The thermal system 100 includes a plurality of thermal elements 102A, 102B, 102C, and 102D. The thermal elements 102A-102D may be anyone of a number of different elements that are capable of generating heat. For example, the thermal elements 102A-102D may be layered heating elements, etched foil elements, or a wire wound elements.

Each of the thermal elements 102A-102D may define a resistor and a current limiting device. More specifically, the thermal element 102A has a resistor 104A and a current limiting device 106A. The thermal element 102B has a resistor 104B and a current limiting device 106B. Similarly, the thermal element 102C has a resistor 104C and a current limiting device 106C. Finally, the thermal element 102D has a resistor 104D and a current limiting device 106D. The current limiting devise 106A-106D may be a diode, a silicon-controlled rectifier, or a silicon-controlled switch.

As such, each of the thermal elements 102A-102D have each respected 104A-104D connected in series with each current limiting device 106A-106D, respectively. Further, the thermal elements 102A and 102C are connected to each other in a parallel fashion. Additionally, also connected in a parallel fashion are thermal elements 102B and 102D. As such, the thermal elements 102A and 102C form a first subset of parallel thermal elements, while the thermal elements 102B and 102D form a second subset of parallel thermal elements.

The thermal system 100 also includes a first power line 108, having a first node 109, and a second power line 110, having a second node 111. The first power line 108 is connected to resistors 104A and 104C, while the second power line 110 is connected to resistors 104B and 104D. As such, the power lines 108 and 110 are configured in pairs for providing power to subsets of the plurality of thermal elements 102A-102D that are connected in a parallel set.

In addition, the system 100 may further include a common power line 112, having a common node 113. The common power line 112 is connected to current limiting devices 106A-106D. As such, each of the current limiting devices 106A-106D in the adjacent parallel sets within a subset are opposed. In other words, the current limiting devices 106A and 106C are opposed to each other, while the current limiting devices 106B and 106D are also opposed to each other.

By selectively providing either a power or ground signal to the power wires 108, 110, and 112, a current can be transmitted through each of the thermal elements 102A-102D, thereby creating heat when the current passes through the thermal elements 102A-102D. The table below illustrates each combination of power (PWR) or ground (GND) signal provided to the power lines 108, 110, and 112 of nodes 109, 111, and 113, respectively. As shown in the table, there flexibility with controlling which thermal elements 102A-102D provides heating the thermal array system.

| Node 109 | Node 111 | Node 113 | Heating Thermal Element |
|---|---|---|---|
| GND | GND | GND | None |
| GND | GND | PWR | 102B, 102C |
| GND | PWR | GND | 102D |
| GND | PWR | PWR | 102C |
| PWR | GND | GND | 102A |
| PWR | GND | PWR | 102B |
| PWR | PWR | GND | 102A, 102D |
| PWR | PWR | PWR | None |

As shown in the table above, the thermal system 100 is such that depending on if power or ground is applied to each of the nodes 109, 111, and 113, the thermal system 100 configured provide a current though at least one of the thermal elements 102A-102D, or just one of the thermal elements 102A-102D. Further, as can be seen in the table, three wires can be used to selectively activate four different thermal elements. As an example, if an array included six thermal systems 100, having a total of twenty-four thermal elements, eighteen wires would be needed to selectively control each of the twenty-four thermal elements. As such, the thermal system 100 allows for the reduction of the wire count of an array of heaters while allowing independent, sequential. Additionally the thermal system 100 allows for all lines to remain low impedance by attaching wires to a voltage source.

Figure 4:
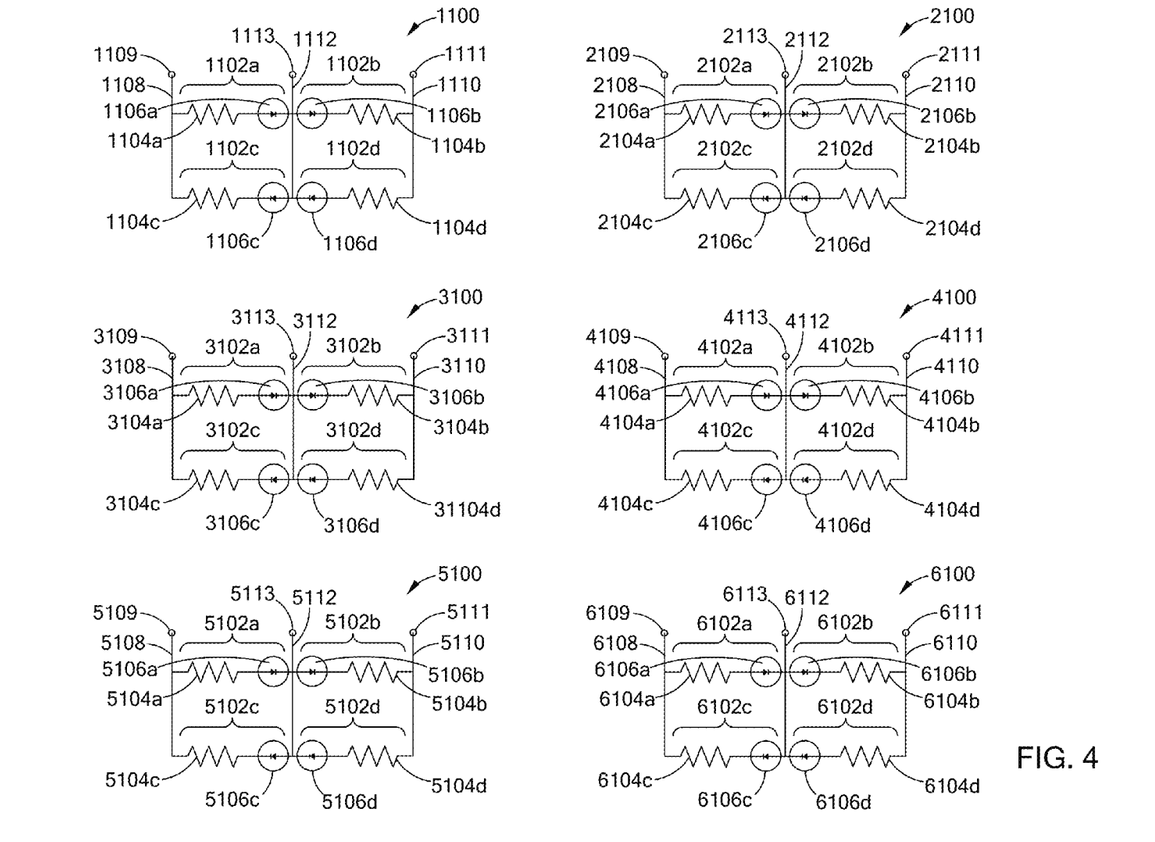
FIG. 4 is a schematic view illustrating six thermal systems having twenty-four thermal elements.

Referring to FIG. 4, an array of thermal systems are shown. Here, the array includes six separate thermal systems 1100, 2100, 3100, 4100, 5100, and 6100. Each of the thermal systems 1100, 2100, 3100, 4100, 5100, and 6100 are comprised of components previously described and referred to by like reference numerals.

In this example, thermal system 1100 has three wires 11108, 1110, and 1112 each having nodes 1109, 1111, and 1113, respectively. In like manner, the thermal array systems 2100, 3100, 4100, 5100, and 6100 also each have three wires, each having nodes, bringing the total number of wires to eighteen. As mentioned above, like reference numerals have been utilized in this figure to refer to like components.

Similarly, the thermal array system 1100 has thermal elements 1102A, 1102B, 1102C, and 1102D. Likewise, each of the thermal array systems 2100, 3100, 4100, 5100, and 6100 also each have four thermal elements as well. In total, the array of thermal systems contains twenty-four thermal elements.

Controlling the twenty-four thermal elements is accomplished by utilizing the eighteen wires previously mentioned. As such, this reduces wire count of an array of heaters while allowing independent, sequential control, and without implementing a Matrix or Metcalf topography. This array also has the additional benefit of allowing all lines to remain low impedance by attaching wires to a voltage source. This array may be run under feedback control from external temperature sensors or it may be run as resistance-based temperature control from feedback based on the ratio of heater voltage divided by heater current. In that case the diode represents a voltage error that could be calibrated out of the system.

Figure 5:
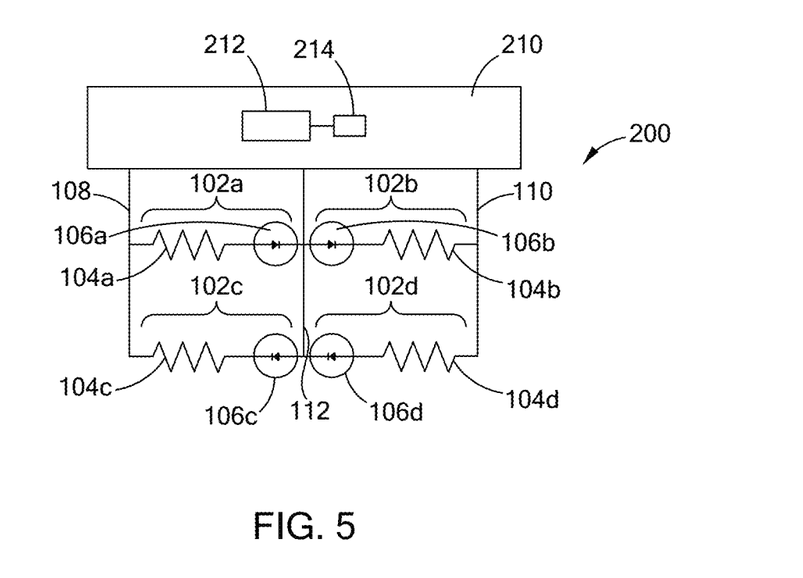
FIG. 5 is a schematic view illustrating a thermal system according to the principles of the present disclosure having a control system.

Referring to FIG. 5, another example of a thermal system 200 is shown. Here, the thermal system 200 includes the thermal elements 102A-102D as described above as well as power lines 108, 110, and 112. Like reference numerals have been utilized to refer to previously described elements. Here, the thermal system 200 includes a control system 210. The control system 210 may include a processor 212 in communication with the memory 214 containing instructions for configuring the processor to perform any one of a number of different methods described in the specification. It should be understood that the processor 212 may be more than one processor. Furthermore, the memory 214 may be separate from the processor 212, as shown, or may be integrated within the processor or processors 212.

The control system 210 may be configured to provide power to a subset of the plurality of thermal elements 102A-102D that are connected in a parallel set. The control system 210 may also be configured to provide the current for a least one of the plurality of thermal elements 102A-102B by selectively applying a voltage, as described in the table above, to power lines 108, 110, and 112.

Figure 6:
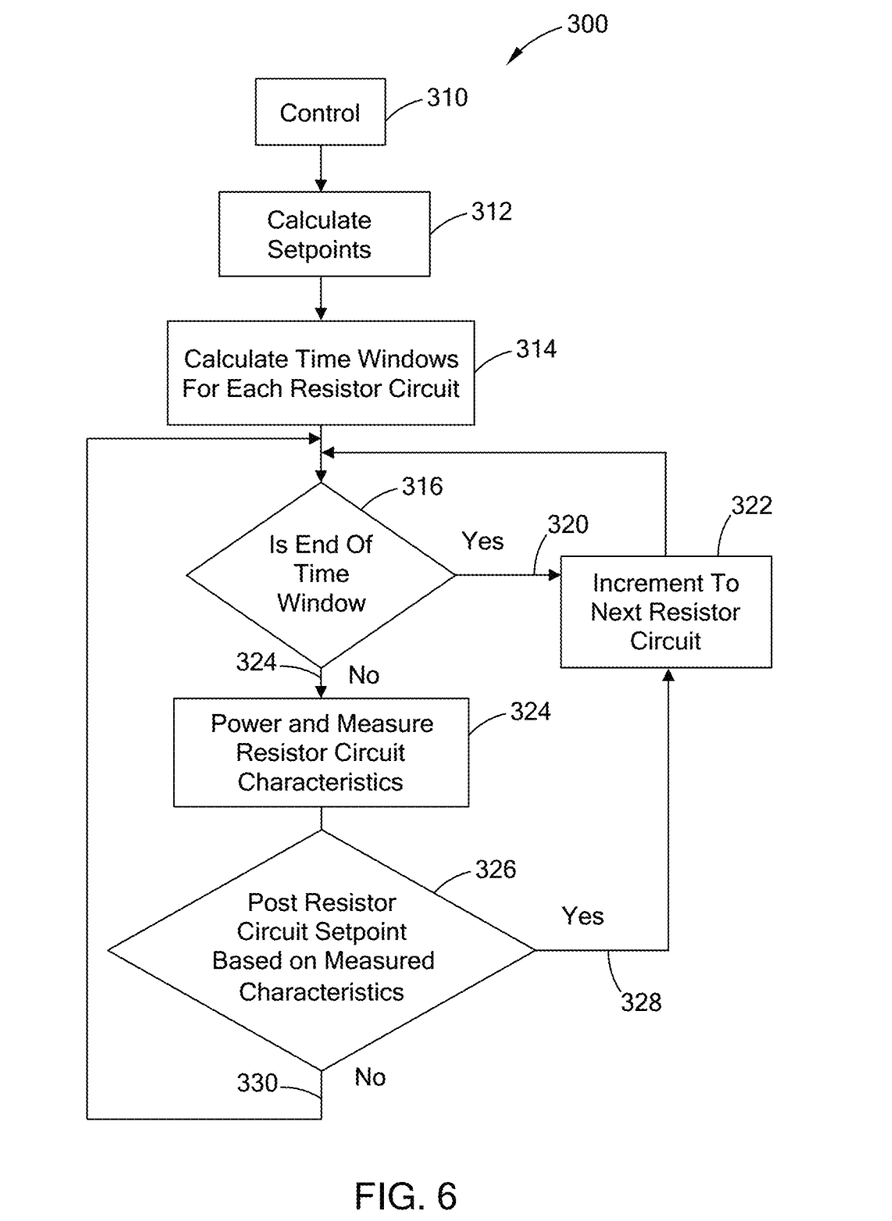
FIG. 6 is a flowchart illustrating a method of controlling a thermal system.

Now referring to FIG. 6, a method 300 is provided for controlling the thermal system. The method 300 can be utilized controlling any of the thermal array systems described and can be executed by any of the control systems described. The method starts at block 310. In block 312 the controller calculates the set points for each thermal element of the array. For example, resistance set points may be set for each thermal element such that a measured resistance for that thermal element can be used as a trigger to stop providing power to that thermal element. In block 314, the time window for each thermal element is calculated. The time window may be the time allotted to power a particular thermal element. Although, if the thermal element resistance is above the set point, the controller may remain dormant for the remainder of the time window or may directly move to the next window to power the next thermal element. However, it may be desirable to have a minimum wait time for each thermal element such that power is not constantly provided to the system for measurement purposes, thereby heating elements beyond what is necessary for the heating application.

Also, it should be understood that method 300 may utilize external temperature sensors to determine the temperature of one or more thermal elements. Therefore, feedback control from external temperature sensors or resistance-based temperature control from feedback based on the ratio of heater voltage divided by heater current. In the case of utilizing resistance-based temperature control, the diode represents a voltage error that could be calibrated out of the system.

In block 316, the controller determines if the end of the time window has been reached for the current thermal element. If the end of the time window had been reached for the current thermal element, the method follows line 320 to block 322. In block 322, the controller increments to the next thermal element within the array and proceed to block 316 where the process continues. If the end of the time window has not been reached the method follows line 318 to block 324. In block 324, the controller may simultaneously provide power to the thermal element and measure electrical characteristics of the thermal element. In block 326, the controller determines if the thermal element has exceeded the resistor circuit set point based on the measured characteristics. If the set point has been exceeded, the method may wait until the timing window is complete or, after some delay, proceed along the line 328 to block 322. In block 322, the resistor circuit is incremented to the next thermal element and the process proceeds to block 316. If the thermal element has not exceeded the set point based on the measured characteristics, the process follows line 330 blocks 316 where the process continues.

Figure 7:
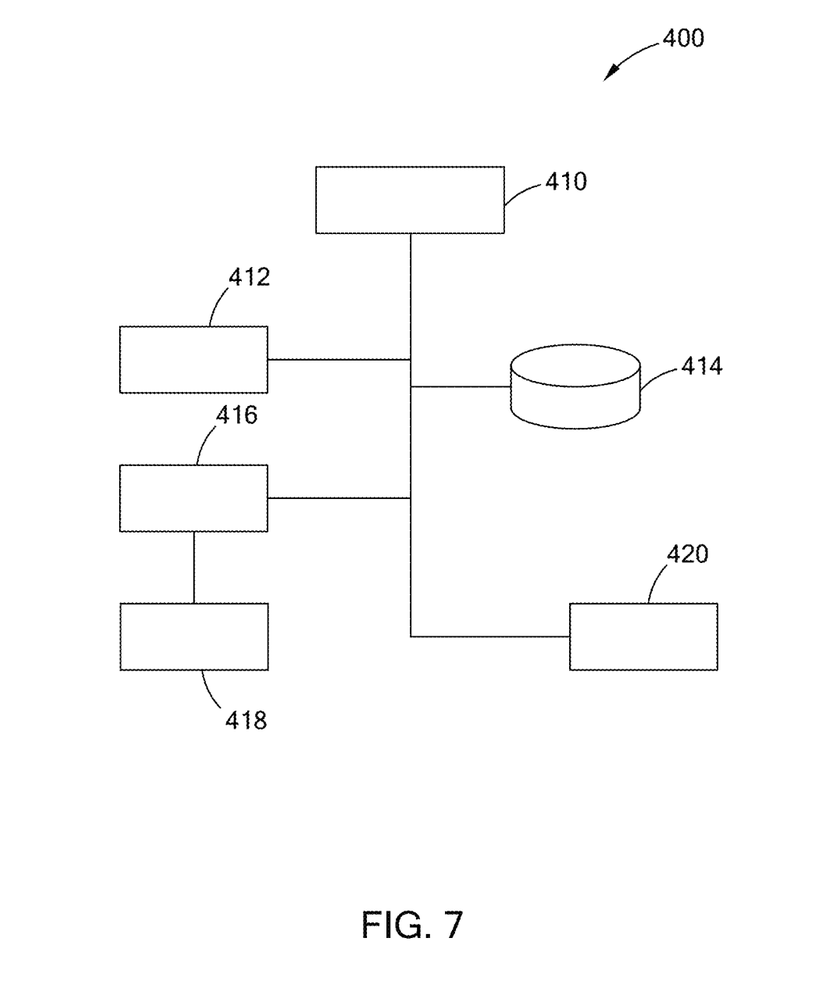
FIG. 7 is a schematic view illustrating a control system for controlling the thermal systems of FIGS. 3, 4, and 5 in accordance with the principles of the present disclosure.

Any of the controllers, control systems, or engines described may be implemented in one or more computer systems. One exemplary system is provided in FIG. 7. The computer system 400 includes a processor 410 for executing instructions such as those described in the methods discussed above. The instructions may be stored in a computer readable medium such as memory 412 or storage devices 414, for example a disk drive, CD, or DVD. The computer may include a display controller 416 responsive to instructions to generate a textual or graphical display on a display device 418, for example a computer monitor. In addition, the processor 410 may communicate with a network controller 420 to communicate data or instructions to other systems, for example other general computer systems. The network controller 420 may communicate over Ethernet or other known protocols to distribute processing or provide remote access to information over a variety of network topologies, including local area networks, wide area networks, the Internet, or other commonly used network topologies.

As a person skilled in the art will readily appreciate, the above description is meant as an illustration of implementation of the principles this invention. This description is not intended to limit the scope or application of this invention in that the invention is susceptible to modification, variation and change, without departing from the spirit of this invention, as defined in the following claims.

The invention claimed is:

1. A thermal system comprising:
a plurality of thermal elements, each of the thermal elements defining a resistor and a current limiting device, the plurality of thermal elements comprising at least a first subset of parallel thermal elements and at least a second subset of parallel thermal elements, wherein the current limiting devices in a given subset of parallel thermal elements have opposite polarity from each other; and
a plurality of power lines connected to the plurality of thermal elements, the power lines configured in pairs for providing power to the first subset and the second subset of parallel thermal elements,
wherein each of the pairs of power lines share a common power line such that the first and second subsets of parallel thermal elements share the common power line.

2. The thermal system of claim 1, further comprising a control system for providing power to the first subset and the second subset of parallel thermal elements.

3. The thermal system of claim 2, wherein the control system is configured to provide a current through at least one of the plurality of thermal elements.

4. The thermal system of claim 2, wherein the control system is configured to provide a current through only one of the plurality of thermal elements.

5. The thermal system of claim 1, wherein the resistor and the current limiting device are connected in series.

6. The thermal system of claim 1, wherein each of the plurality of power lines defines a node.

7. The thermal system of claim 1, wherein the current limiting device is selected from the group consisting of a diode, a silicon-controlled rectifier, and a silicon-controlled switch.

8. The thermal system of claim 1, wherein the resistor is a heating element selected from the group consisting of a layered heating element, an etched foil element, or a wire wound element.

9. The thermal system of claim 1, wherein:
the number of plurality of power lines is three; and
the number of the plurality of thermal elements is four.

10. The thermal system of claim 9, further comprising a control system for providing power to the first subset and the second subset of parallel thermal elements.

11. The thermal system of claim 10, wherein the control system is configured to provide a current through at least one of the plurality of thermal elements.

12. The thermal system of claim 11, wherein the control system is configured to provide a current through only one of the plurality of thermal elements.

13. A method of controlling temperature of a heater comprising employing the thermal system according to claim 1.

14. The heater system of claim 1, wherein the first subset of parallel thermal elements is connected to one power line of a respective pair of power lines and the second subset of parallel thermal elements is connected to the other power line of the respective pair of power lines, further wherein the first subset and the second subset of parallel thermal elements are connected to the common line.

15. A heater system comprising:
a heating target;
a heater secured to the heating target, the heater comprising a plurality of thermal elements, each of the thermal elements defining a resistor and a current limiting device, the plurality of thermal elements comprising at least a first subset of parallel thermal elements and at least a second subset of parallel thermal elements, wherein the current limiting devices in a given subset of parallel thermal elements have opposite polarity from each other; and
a plurality of power lines connected to the plurality of thermal elements, the power lines configured in pairs for providing power to the first subset and the second subset of parallel thermal elements,
wherein each of the pairs of power lines share a common power line such that the first and second subsets of parallel thermal elements share the common power line.

16. The heater system of claim 15, further comprising a control system for providing power to the first subset and the second subset of parallel thermal elements.

17. The heater system of claim 16, wherein the control system is configured to provide a current through at least one of the plurality of thermal elements.

18. The heater system of claim 16, wherein the control system is configured to provide a current through only one of the plurality of thermal elements.

19. The heater system of claim 15, wherein the resistor and the current limiting device are connected in series.

20. The heater system of claim 15, wherein the resistor is a heating element selected from the group consisting of a layered heating element, an etched foil element, or a wire wound element.

21. The heater system of claim 15, wherein:
the number of plurality of power lines is three; and
the number of the plurality of thermal elements is four.

22. The heater system of claim 15, wherein the first subset of parallel thermal elements is connected to one power line of a respective pair of power lines and the second subset of parallel thermal elements is connected to the other power line of the respective pair of power lines, further wherein the first subset and the second subset of parallel thermal elements are connected to the common power line.

* * * * *